April 21, 1970 JAMES E. WEBB 3,507,706

ADMINISTRATOR OF THE NATIONAL AERONAUTICS AND SPACE ADMINISTRATION

ME.HOD OF USING PHOTOVOLTAIC CELL USING POLY-N-VINYL-CARBAZOLE COMPLEX

Filed April 4, 1968

INVENTORS
ALLEN M. HERMANN
ALAN REMBAUM
BY [signatures]
ATTORNEYS 3,507,706
Patented Apr. 21, 1970

3,507,706

METHOD OF USING PHOTOVOLTAIC CELL USING POLY-N-VINYL-CARBAZOLE COMPLEX

James E. Webb, Administrator of the National Aeronautics and Space Administration, with respect to an invention of Allen M. Hermann, New Orleans, La., and Alan Rembaum, Altadena, Calif.

Filed Apr. 4, 1968, Ser. No. 718,752
Int. Cl. H01e *15/02;* C08f *7/16*
U.S. Cl. 136—89 4 Claims

ABSTRACT OF THE DISCLOSURE

A method of producing an output voltage from a photovoltaic cell utilizing poly-N-vinylcarbazole complexed with iodine as the photovoltaic material.

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

Field of the invention

This invention relates to photovoltaic materials. More particularly, the invention pertains to the use of a novel complex as a photovoltaic material and the new use of an old element as a photovoltaic material.

Description of the prior art

Prior to the herein invention, it has been reported that organic semiconductors have exhibited large photovoltaic effects. An example of such an organic semiconductor is anthracene. However, most of the organic semiconductors that possess photovoltaic properties exhibit very high impedances, a severe limitation on the maximum available power. The resistivity of anthracene, for example, is greater than $10^{14}$ ohm-cm.

In order to obtain low impedance photovoltages current solar cells use N-type gallium arsenide. Typical current photovoltaic materials use crystalline surfaces of silver, cesium, and oxides of these metals. However, these materials are costly and difficult to prepare.

In addition to the foregoing, various polymeric materials including poly-N-vinylcarbazole are known as charge transfer materials. Often they have been complexed to form charge transfer complexes. As such, the prior art has utilized these materials, as photoconductors. They have found application, as such, in electrophotographic processes in which an electrostatic latent image is produced utilizing the photoconduction property of the material. For example, poly-N-vinylcarbazole is formed as a photoconductive layer on a base such as paper and the like. The carbazole can additionally contain additives such as dyes, metal halides and the like to increase its sensitivity. The layer is sensitized by a corona discharge which applies a charge to the layer. The art however has never appreciated or recognized that some of the charge transfer materials could under proper conditions be utilized as photovoltaic compositions. It should be pointed out that it is well known that a photoconductor does not inherently or necessarily possess such photovoltaic properties. It is perhaps for this reason that the art has failed to recognize this possibility.

Thus, it is an object of this invention to provide new photovoltaic material.

Another object of this invention is to provide organic photovoltaic materials having a relatively low impedance.

Still another object of this invention is to provide a new use for an old known material wherein such material is used for a photovoltaic effect.

SUMMARY OF THE INVENTION

The aforegoing and other objects of this invention are accomplished by the use of a poly-N-vinylcarbazole and iodine charge transfer complex as a photovoltaic material. It has been found that films cast of poly-N-vinylcarbazole when complexed with iodine produce significant photovoltages with a relatively low impedance on the order of 2 megohms. The complex of the poly-N-vinylcarbazole and iodine produced a significantly higher photovoltage than the monomeric complex of N-ethylcarbazole with iodine, although N-ethylcarbazole, for example, is additionally a known photoconductor. This highlights the fact that one cannot draw a comparison between the photoconductivity of a material and the production of a photovoltaic effect. Further, it was found that iodine alone produced a photovoltaic effect. The maximum current from the photovoltage of iodine alone was found to be slightly less than that of the complex of N-ethylcarbazole with iodine. However, it is believed that the discovery of the photovoltaic effect of iodine is important due to the fact that it is extremely inexpensive in comparison to the complexes formed, and for this reason alone, would bear consideration.

It is believed that the invention will be better understood from the following detailed description and drawings in which.

Figure 2:
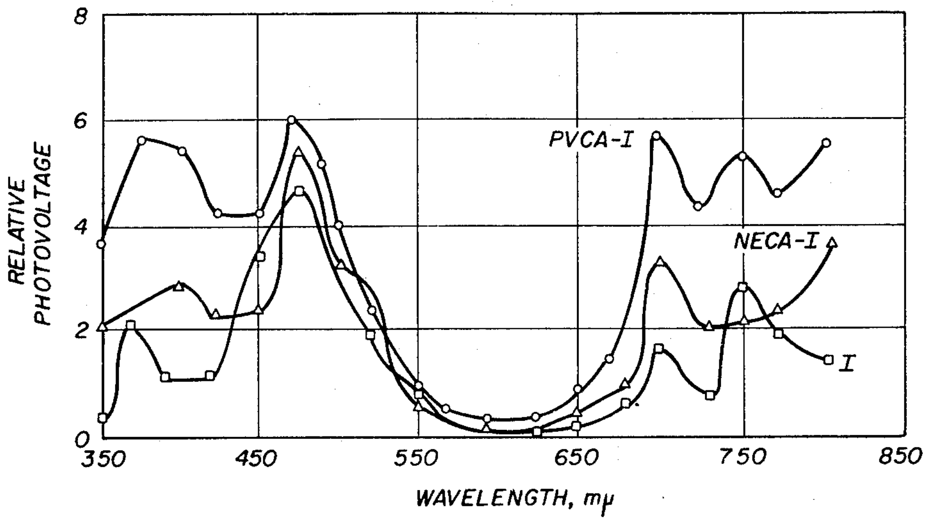
FIG. 2 is a graph which shows the spectral dependence of the photovoltaic effect for materials of this invention.

Various approaches can be used to form the film of poly-N-vinylcarbazole-iodine complex, in order to observe and test photovoltaic effects. The first approach involves dissolving the poly-N-vinylcarbazole, hereinafter referred to as PVCA, in a suitable solvent such as dichloromethane. After the PVCA has been completely dissolved, iodine in the desired amount is added to the solution. Material can then be poured on a conductive glass plate to form the film allowing the solvent to evaporate therefrom. The solvent is generally evaporated under vacuum conditions, while the glass plate on which the film is formed is cooled to prevent the iodine from evaporating. As a slight alternative to this process, one could start with an excess of iodine being added to the solution of the PVCA and evaporate the iodine together with the solvent to the point where the desired amount of iodine remains as part of the complex film material.

A second approach to forming films of this invention could involve merely heating to the melting point iodine and adding PVCA to the melted material in the amount desired. One most likely will not obtain as homogeneous a mixture utilizing this second approach, however it should be sufficient for obtaining a photovoltaic effect.

A third approach is to form a film of PVCA which can be commercially obtained. The film could then be put into a jar and exposed to iodine vapors at, for example, 40° C. The film will turn darker as the amount of iodine is complexed with the PVCA. For example, at 5% iodine by weight the film turns yellow, while at 30% the film turns dark to almost black.

In order to test the effectiveness of the films of this invention, two plates or slides of conventional conductive glass are utilized. The plates are overlapped with a film of the material of this invention, covering one of the slides completely, while the second slide overlaps the first one and is in tight contact with the film. The slides are then connected to a millivoltmeter where, upon exposure to light, a reading is obtained indicating the photovoltaic effect.

When iodine alone is utilized to form a film, pure iodine is melted at about 100° C. and coated upon one of the plates utilized. Before the coating cools to a solid layer, the second plate is placed thereupon. Upon cooling, a solid layer of iodine is thus formed and tightly adheres to the two conductive glass plates.

The films of this invention vary in thickness from 3 to 10 mils. The dependence of the photovoltaic behavior upon the thickness of the film has not been investigated. In the complex of PVCA and iodine, the amount of iodine present can vary from 5 to 30 weight percent of the film. It has been found that at the higher amount the photovoltaic property will increase. The maximum amount of iodine that will complex with PVCA is 64 weight percent of the composition. It is believed that the invention will be better understood from the following detailed example:

Example I

One gram of PVCA having an average molecular weight of approximately 400,000 was added to 50 milliliters of dichloromethane as solvent therefor. The PVCA was dissolved in the solvent by stirring for two hours at room temperature. Then .4 gram of iodine crystals were added to the dissolved PVCA. This was mixed until an homogeneous solution was obtained. The mixture was then poured onto a conductive glass plate which was 3 x 1 inches and 1/16 inch thick. The glass plate was coated on one side with tin oxide which has a resistance of 100 ohms per square. The mixed solution was poured onto the tin oxide coating to a thickness of between 10 to —100 mils. The slide glass plate was then placed in a bell jar and was in contact with a cooled coil having a cryogenic passing therethrough. The jar was then evacuated which served to remove the dichloromethane solvent from the film while the iodine remained complexed with the PVCA. While the film having a thickness of 3 to 10 mils was still tacky, a second plate, having the same dimensions as the first, was placed on top of it, overlapping the first plate. The second plate was also coated on one side with tin oxide. This coated side was placed in contact with the tacky film. Evacuation was then continued to obtain a dry film. The aforegoing provided a film of PVCA having 30 weight percent of iodine complexed therewith.

Figure 1:
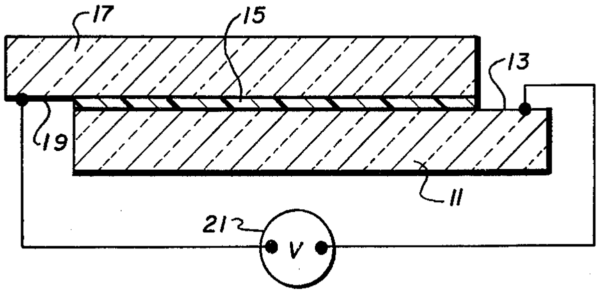
FIG. 1 is a pictorial representation of the arrangement utilized to test the effectiveness of the materials of this invention.

FIG. 1 depicts a typical arrangement of the overlapping plates to form a sandwich cell. A first plate 11 has a coating of tin oxide 13 with the film 15 on top of the tin oxide. A second plate 17, as can be seen, overlaps the first plate 11. It likewise has a coating of tin oxide 19 which is in contact with the film 15. Each plate is connected through leads to a millivoltmeter 21 to form a circuit.

Example II

A film of PVCA alone was cast on a conductive glass plate having the dimensions and coating as indicated in Example I. The film had a thickness between 7 and 10 mils. The film was cast by evaporation of the dichloromethane solvent from the PVCA. The plate with the film thereon was then placed in a sealed container and was exposed to iodine vapors from solid iodine at room temperature. The plate was weighed periodically until a 30 percent increase in weight of the film was obtained. The plate was then placed in contact with a second glass slide in the arrangement shown in FIG. 1. The plates were then raised briefly to 100° C. while slight pressure was maintained to form a good seal of the film between the two plates.

Example III

A film of pure iodine was formed on a conductive glass slide by initially melting iodine crystals at 100° C. The thickness of the film was about 10 mils. A second slide was then slightly pressed together with the coated one and the two allowed to cool to form a solid layer of iodine.

Example IV

Iodine crystals were added to solid N-ethylcarbazole, NECA, to final proportions of about 30% by weight of iodine. The complex was then placed on a conductive glass slide, and a cell assembled and heated as in Example III.

In order to test the films formed in accord with the foregoing examples, one side of each sandwich cell was illuminated with light from a 200 watt mercury lamp which was passed through a Bausch and Lomb monochromator. An absolute intensity calibration was made with an Eppley Thermopile #5890 and a Keithley 149 millimicrovoltmeter. Constant intensity was maintained at various wavelengths by spectrally flat neutral density filters of appropriate optical density. Photovoltage determinations were made with an HP412A vacuum tube voltmeter.

Turning to FIG. 2 there is seen a comparison for the three different types of films tested. The chart depicts the relative photovoltage obtained from the films dependent upon the wavelength of light. The absolute photovoltage obtained ranged from 5 to 20 microvolts for the film of PVCA-iodine. As can be seen from the region of 475 to 675 m$\mu$ all three films produced essentially the same photovoltage with very little voltage obtained in the region of 575 to 650 m$\mu$. The film of the PVCA and iodine was significantly better than the other materials, however, in the region of 350 to 425 m$\mu$, and from 675 to 800 m$\mu$.

Figure 3:
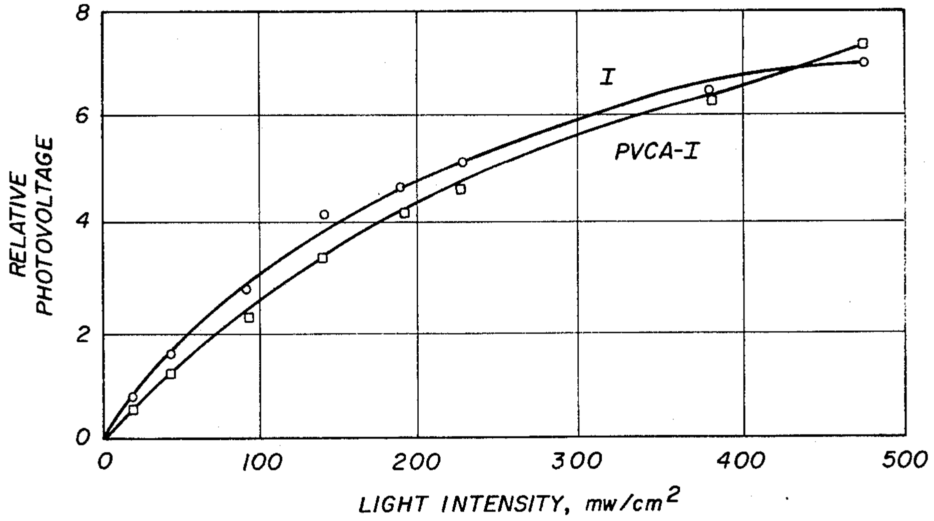
FIG. 3 is a graph depicting the intensity dependence of the photovoltaic effect for the materials of this invention.

FIG. 3 discloses the intensity dependence of the photovoltage with incident white light. The photovoltage can be seen to depend linearly on the intensity below 140 mw./cm.$^2$ and on the square root of intensity above this value. This dependence on intensity contrasts with other known organic systems such as, for example, anthracene whose photovoltage is relatively insensitive to intensity. Additionally, it is to be noted that both the materials tested, iodine alone and PVCA and iodine, are about equally dependent on intensity.

As can be seen, both of the graphs of FIGS. 2 and 3, respectively, are based on relative photovoltages of the different materials tested. The actual maximum photovoltages obtained for the PVCA-I complex varied between 15 and 20 mv. The maximum voltages for pure iodine varied between 10 and 15 mv., while the NECA-I complex did not exceed 2 mv. output. Though the data was obtained with a complex containing 30 weight percent iodine, a greater amount of iodine will produce higher photovoltaic output. Thus, a complex containing 40 to 70 weight iodine will give increased results.

What is claimed is:

1. A method of obtaining a voltage output from a light source comprising:

providing a photovoltaic material of a complex of poly-N-vinylcarbazole and iodine, connecting said photovoltaic material to a suitable output circuit, subjecting said material to a light source whereby an output voltage is produced.

2. The method of claim 1 further comprising: forming said poly-N-vinylcarbazole iodine complex into a film prior to connecting it to said circuit.

3. The method of claim 1 wherein said complex comprises up to 64 weight percent iodine.

4. The method of claim 1 wherein said complex comprises 30 weight percent iodine.

References Cited

UNITED STATES PATENTS 3,024,225 3/1962 Teot ———— 260—88.3 X
3,057,947 10/1962 Calvin et al. ———— 136—89

3,060,028 10/1962 Dersch ———— 260—88.3 X
3,117,125 1/1964 Wilson ———— 252—62.3 X
3,231,500 1/1966 Frant ———— 252—62.3
3,403,165 9/1968 Matsunaga ———— 252—62.3

OTHER REFERENCES

Comprehensive Inorganic Chemistry, Sneed et al., vol. 3, "The Halogens," D. Van Nostrand Co. Inc. (1954), pp. 80–81.

ALLEN B. CURTIS, Primary Examiner

U.S. Cl. X.R.

252—62.3; 260—88.3

UNITED STATES PATENT OFFICE
CERTIFICATE OF CORRECTION

Patent No. 3,507,706 Dated April 21, 1970

Inventor(s) Allen M. Hermann and Alan Rembaum

It is certified that error appears in the above-identified patent and that said Letters Patent are hereby corrected as shown below:

Column 4, line 40, "microvolts" should read -- millivolts --.

Signed and sealed this 26th day of September 1972.

(SEAL)
Attest:

EDWARD M.FLETCHER,JR.
Attesting Officer

ROBERT GOTTSCHALK
Commissioner of Patents